US005589687A

United States Patent [19]
Kawata et al.

[11] Patent Number: 5,589,687
[45] Date of Patent: Dec. 31, 1996

[54] INFRARED DETECTION DEVICE COMPRISING A PYROELECTRIC THIN FILM AND METHOD FOR FABRICATING THE SAME

[75] Inventors: Satoshi Kawata; Masaji Dohi; Yoichiro Sakachi; Hiroshi Daiku, all of Kawasaki, Japan

[73] Assignee: Fujitsu Limited, Kawasaki, Japan

[21] Appl. No.: 413,958

[22] Filed: Mar. 30, 1995

[30] Foreign Application Priority Data

Apr. 18, 1994 [JP] Japan .................................. 6-101682

[51] Int. Cl.$^6$ ...................................................... G01J 1/02
[52] U.S. Cl. .......................................... 250/338.3; 250/332
[58] Field of Search ................................. 250/338.3, 332

[56] References Cited

U.S. PATENT DOCUMENTS

| | | | |
|---|---|---|---|
| 4,996,428 | 2/1991 | Voles | 250/332 |
| 5,047,644 | 9/1991 | Meissner et al. | 250/332 |
| 5,130,542 | 7/1992 | Sibbald et al. | 250/338.3 |

FOREIGN PATENT DOCUMENTS

| | | |
|---|---|---|
| 2282261 | 3/1995 | United Kingdom . |
| 7115 | 3/1994 | WIPO ..................................... 250/332 |

OTHER PUBLICATIONS

J. Chen et al., "Rapid thermal annealing of sol-gel derived lead zirconate titanate thin films", J. Appl. Phys. 71(9), May 1, 1992, pp. 4465–4469.

N. Tohge et al., "Preparation of $PbZrO_3$–$PbTiO_3$ Ferroelectric Thin Films by the Sol–Gel Process", J. Am. Ceram. Soc. 74(1), Jan. 1991, pp. 67–71.

R. Takayama et al., National Technical Report vol. 39 No. 4, Aug. 1993, pp. 122–130.

Great Britain Search Report; Application No. GB 9507900.0; Dated Jul. 14, 1995.

Ferroelectrics vol. 104 1990 (UK); R. W. Whatmore et al. "Ferroelectric Materials for IR Sensors State-of-the-Art and Perspectives", pp. 269–283.

*Primary Examiner*—Carolyn E. Fields
*Attorney, Agent, or Firm*—Armstrong, Westerman, Hattori, McLeland & Naughton

[57] ABSTRACT

An infrared detection device has a substrate with a plurality of hollow mesas and a pyroelectric thin film formed on the surface having the mesas.

11 Claims, 10 Drawing Sheets

INFRARED DETECTION DEVICE COMPRISING A PYROELECTRIC THIN FILM AND METHOD FOR FABRICATING THE SAME

BACKGROUND OF THE INVENTION

The present invention relates to an infrared detection device utilizing the spontaneous polarization change caused in a pyroelectric thin film with the temperature rise thereof by the irradiation of infrared rays, in particular, to an infrared image sensing device having a linear or two-dimensional array of a plurality of sensor elements each comprising a pyroelectric thin film.

It is well-known that infrared sensors comprising a crystal of a semiconductor such as HgCdTe or InSb are used as a high sensitivity and high response speed infrared detection device for 4- to 5- micron band and 8- to 12- micron band. These sensors generally have to be operated at the liquid nitrogen temperature or lower. Moreover, these sensors need an optical scanning mechanism in order for obtaining picture elements of infrared images. Accordingly, the infrared image sensing device using these sensors is expensive and comparatively large-sized, and the application thereof is limited to special fields such as medical, military and others.

On the other hand, a low-cost infrared image sensing device suitable for monitoring a human body or machine under operation in a room during night, for instance, is demanded for security purposes. The sensor for these purposes is required to be neither high sensitivity nor the high response speed compared with those required in the above-mentioned special fields.

Infrared sensors comprising a pyroelectric material are being developed, aiming at the application as mentioned above. The pyroelectric infrared sensors are operable in the room temperature, and hence, can comply with the low-cost requirement, while offering a sensitivity and response speed enough for the application.

Pyroelectric material is a kind of ferroelectric material such as PbTiO3 and the spontaneous polarization thereof changes when the temperature of the material is raised by the irradiation of infrared rays. According to the change in the spontaneous polarization, the surface charge of pyroelectric material changes. The change in the surface charge is detected as a voltage or a current. The sensor elements each comprising a pyroelectric material are arranged as a linear or two-dimensional array. The signal output from the sensor elements constitute the picture elements of an infrared image.

Various pyroelectric infrared sensor elements are reported, including 1) a structure comprising a thin plate of pyroelectirc ceramics (R. E. Flannery et al., SPIE Vol. 1689 Infrared Imaging System (1992)/379) and 2) another structure comprising a pyroelectric thin film formed by sputtering a pyroelectric material (R. Takayama et al., National Technical Report Vol. 39 No. 4 August 1993, p. 122).

In addition, although being not limited to the application to the infrared sensors, reported is a method of forming a pyroelectric thin film by using a solution of a precursor of a pyroelectric material (J. Chen et al., J. A. Phys. 71 (9), 1 May 1992, p. 4465; N. Tohge et al. J. Am. Ceram. Soc. 74 (1) 67–71 (1991)).

The above third method is referred to as a sol-gel process. That is, a solution composed of the precursor of a pyroelectric material is coated to form a layer on a surface, and the coated layer is then converted into a pyroelectric thin film by a heat treatment. Since the procedure and equipment necessary for such sol-gel process are relatively simple compared with those for the conventional thin film technology such as sputtering and chemical vapor deposition, the advantage of forming a pyroelectric thin film at a low-cost can be offered.

SUMMARY OF THE INVENTION

The coating solution used in a sol-gel process is prepared by dissolving alkoxides of elements, i.e. $(C_2H_5O)_4Pb$ and $(C_2H_5O)_4Ti$ which constitute a ferroelectric material like PbTiO3 (lead titanate), in an organic solvent, and then hydrolyzing them by adding water to the alkoxide solution, for instance. The coating solution thus prepared is applied to a smooth surface of a substrate by using spin coating technique, for example, so as to form a layer of the precursor of the ferroelectric material. The pyroelectric material precursor layer is dried, and then, is subjected to a heat treatment at a higher temperature so as to be converted into a pyroelectric thin film. The above sequence from the coating to the baking are repeated until the thickness of the pyroelectric thin film reaches a desired level.

However, a large amount of stress is generated in the pyroelectric material precursor layer or pyroelectric thin film during the sol-gel process. This is because of the shrinkage of the precursor layer due to the dehydration thereof during the drying and the heat treatment. Accordingly, cracks are readily caused in the pyroelectric thin film.

If a crack exists in a pyroelectric thin film at least in an effective area thereof, the characteristics of individual sensor elements in an infrared image sensing device become not uniform. Moreover, breakdown would occur in the pyroelectric thin film through the crack when a voltage is applied across the film, causing not only flaw points in the infrared image detected by the sensing device but also a serious damage to make the sensing device invalid. Thus, the cracks in the pyroelectric thin film result in the cause of reducing the quality and the reliability of the infrared image sensing device.

To avoid occurrence of cracks in a pyroelectric thin film formed by the sol-gel process, it was tried to employ a precursor solution of low viscosity so as to reduce the thickness of a layer obtained by each coating process. However, a long time was required for obtaining a pyroelectric thin film of desired thickness, because of the increase in the repetition of the process sequence. As a result, the process cost was raised and the film quality was deteriorated due to the increase in the contaminations by the dust particles adhering to the film, and hence, the production yield was reduced.

Therefore, an object of the present invention is to provide a low cost and high reliability infrared detection device which comprises a pyroelectric thin film including a plurality of effective regions for detecting infrared rays, wherein the infrared detection device has a structure which makes the pyroelectric thin film free from the problems as mentioned above.

Another object of the present invention is to provide a method for fabricating a low cost and high reliability infrared detection device which comprises a pyroelectric thin film including a plurality of effective regions for detecting infrared rays, wherein the pyroelectric thin film is formed on a substrate according to sol-gel process so as to be free from the problems as mentioned above.

Still another object of the present invention is to provide a method for forming a pyroelectric thin film on a substrate according to sol-gel process, wherein the pyroelectric thin film is made free from occurrence of cracks in each of effective regions thereof, even when a high viscosity solution of a pyroelectric material precursor is used.

To attain the above mentioned objects, the infrared detection device of the present invention comprises a substrate provided with a plurality of mesas on a surface thereof and a pyroelectric thin film is formed on the surface, and the method of fabricating the infrared detection device comprises the steps of forming a plurality of mesas on a surface of a substrate and forming a pyroelectric thin film surface according to sol-gel process.

DESCRIPTION OF PREFFERED THE EMBODIMENTS

Figure 1A:
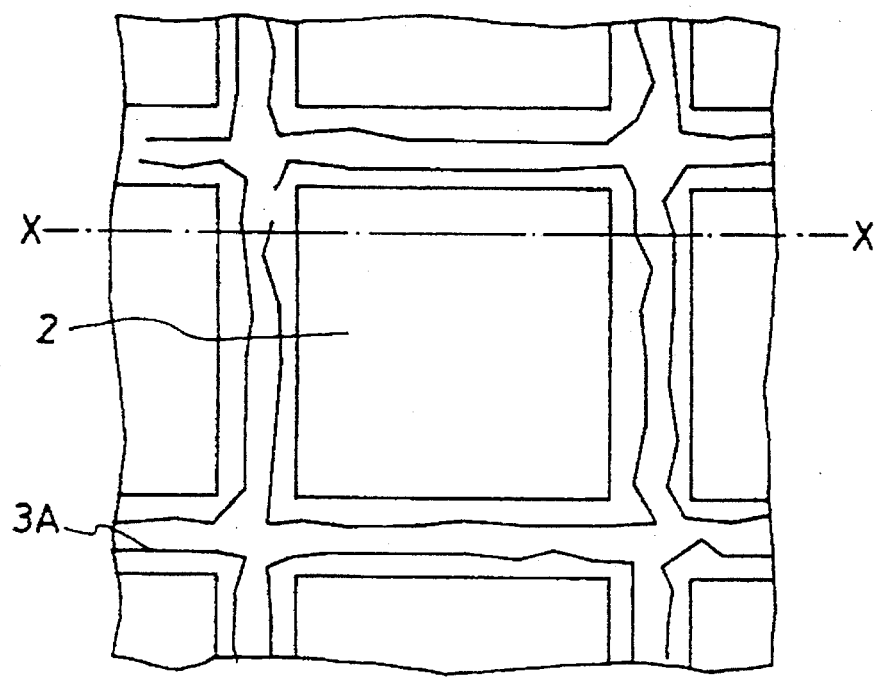
FIGS. 1A and 1B are a plan view and a corresponding cross-section, respectively, for explaining the principle of the present invention.
Figure 1B:
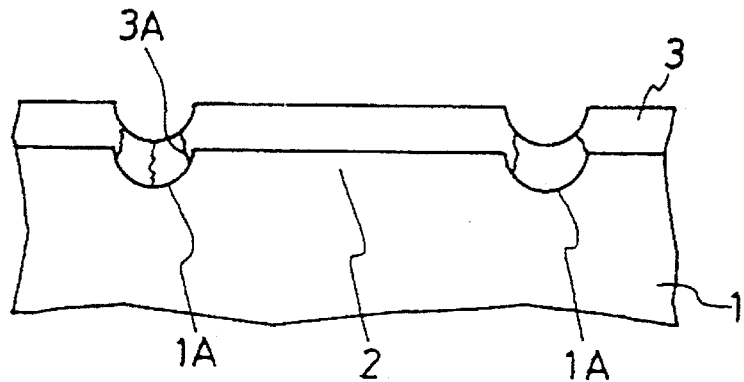

FIGS. 1A is a plan view illustrating a pyroelectric thin film 3 formed on a substrate 1 such as a silicon wafer according to the present invention, and FIG. 1B is a cross section taken along the line x—x in FIG. 1A.

A plurality of mesas 2 arranged in a two-dimensional array, for instance, are formed on a surface of the substrate 1 in advance. Reference numeral 1A denotes a groove between the adjoining mesas 2. As mentioned later, the mesas 2 may be formed of the portion of an insulation layer covering the surface of the substrate 1, or, may be formed from another insulation layer deposited on the first insulation layer covering the surface of the substrate 1, or may be transformed into a hollow structure at an appropriate subsequent step.

As shown in FIGS. 1A and 1B, a pyroelectric thin film 3 has been formed on the surface of the substrate 1 by using sol-gel process. That is, a solution of a precursor of a pyroelectric material is coated on the entire surface of the substrate 1 having the mesas 2, and the layer of the precursor is dried and then is converted into a pyroelectric thin film by a conventional heat-treatment using a furnace.

In general, a substantially large stress is generated in the pyroelectric thin film, and hence, cracks occur in the film. However, in the present invention, since the pyroelectric thin film 3 is formed on a surface of the substrate 1 on which a number of mesas 2 are provided in advance, the stress in the film 3 concentrates in the groove 1A, and therefor, the occurrence of cracks 3A is limited to the portion of the pyroelectric thin film 3 in the groove 1A.

After the portion of the pyroelectric thin film 3 in the groove 1A has been selectively removed, the cracks 3A can no longer extend to the pyroelectric thin film 3 left on each of mesas 2. Thus, the pyroelectric thin films 3 on the mesas 2 can be used for an infrared detection device. In particular, when the mesas 2 are arranged with an appropriate fine pitch, the pyroelectric thin films 3 on the mesas 2 can be used for the sensor elements of an infrared image sensing device. Since the pyroelectric thin films 3 are separated from each other by the groove 1A, the thermal interference therebetween is alleviated. As a result, a sharp detection image can be obtained by the infrared image sensing device comprising the pyroelectric thin films 3.

Figure 2:
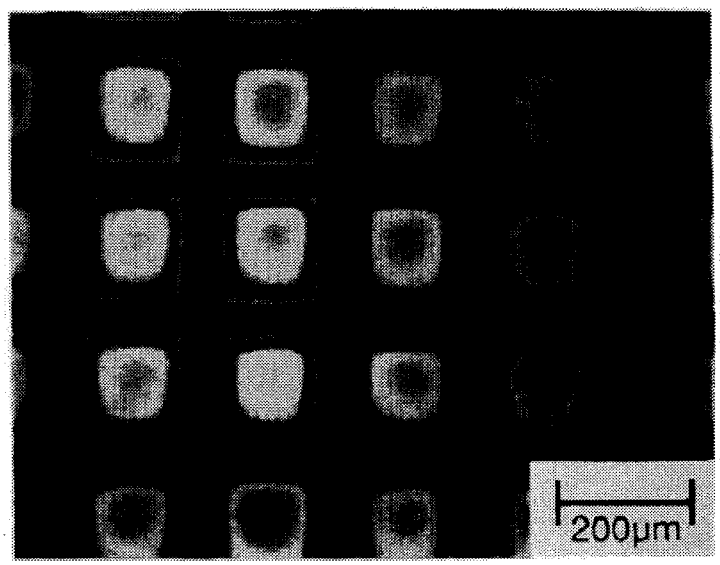
FIG. 2 is a microscopic view of the surface of a pyroelectric thin film formed on a substrate by using the present invention.

FIG. 2 is a microscopic view of the surface of a pyroelectric thin film formed on a substrate by using the present invention, wherein the pyroelectric thin film is formed on the entire surface of a substrate having mesas as explained with reference to FIGS. 1A and 1B.

The pyroelectric thin film is formed of $BaSrTiO_3$ (barium-strontium titanate; referred to as BST hereinafter) and has a thickness of about 0.5 μm. The mesas in FIG. 2 is formed by etching the surface of a silicon wafer of 2 inch in diameter, having a size of approximately 150 μm square. The surface of the mesas is coated with a platinum thin film of 150 nm in thickness. The distance between the adjoining mesas is about 50 μm.

As shown in FIG. 2, none of defects such as cracks is observed in the BST pyroelectric thin film on the mesas. Under the observation with higher magnification, any cracks could not be found in the BST pyroelectric thin film on the mesas.

Figure 3:
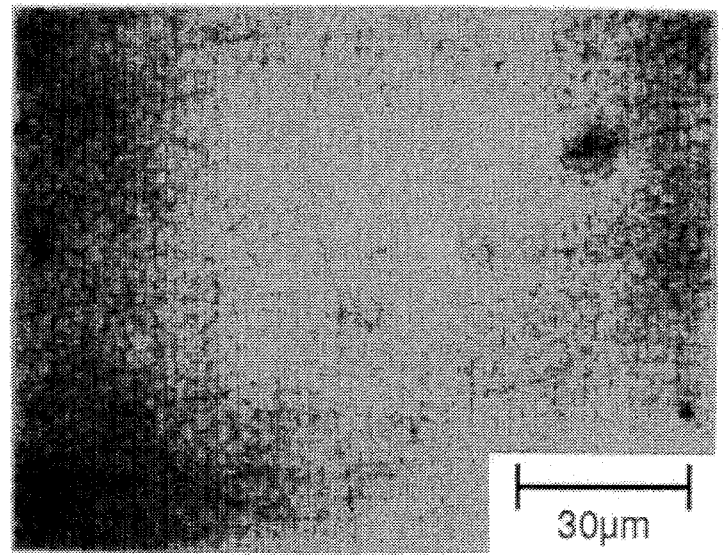
FIG. 3 is a microscopic view of the surface of a pyroelectric thin film formed on a substrate by using a conventional method.

FIG. 3 is a microscopic view of the surface of a pyroelectric thin film formed on a substrate the same as above by using a conventional method.

As shown in FIG. 3, in case of a pyroelectric thin film formed on a substrate without mesas, cracks extending in a length larger than 100 μm are observed together with a number of island-like patterns having a size of approximately 3 μm. The cracks further extend across the substrate surface. If a crack of an order of 100 μm or more existed in the pyroelectric thin film formed on a substrate having mesas as according to the present invention, such large crack should be observed in the pyroelectric thin film on the mesas shown in FIG. 2.

The large crack like in FIG. 3 should not only make the characteristics of the infrared senor elements comprising a pyroelectric thin film not uniform but also reduce the reliability of the infrared image sensing device due to the breakdown in the pyroelectric thin film as mentioned before.

Referring again to FIG. 2, because of none of occurrence of large cracks, the present invention permits to provide an infrared image sensing device comprising BST pyroelectric thin films having uniform characteristics and high reliability. Further, according to the present invention, it is unnecessary to employ a diluted solution of a pyroelectric material precursor in the sol-gel process for fabricating a pyroelectric thin film, and a pyroelectric material precursor solution of relatively high viscosity can be employed instead. Hence required is a fewer repetition of process from coating to heat-treatment for obtaining a pyroelectric thin film having a desired thickness. This results in the advantage of a reduced process time and improvement in the yield of products.

Figure 4:
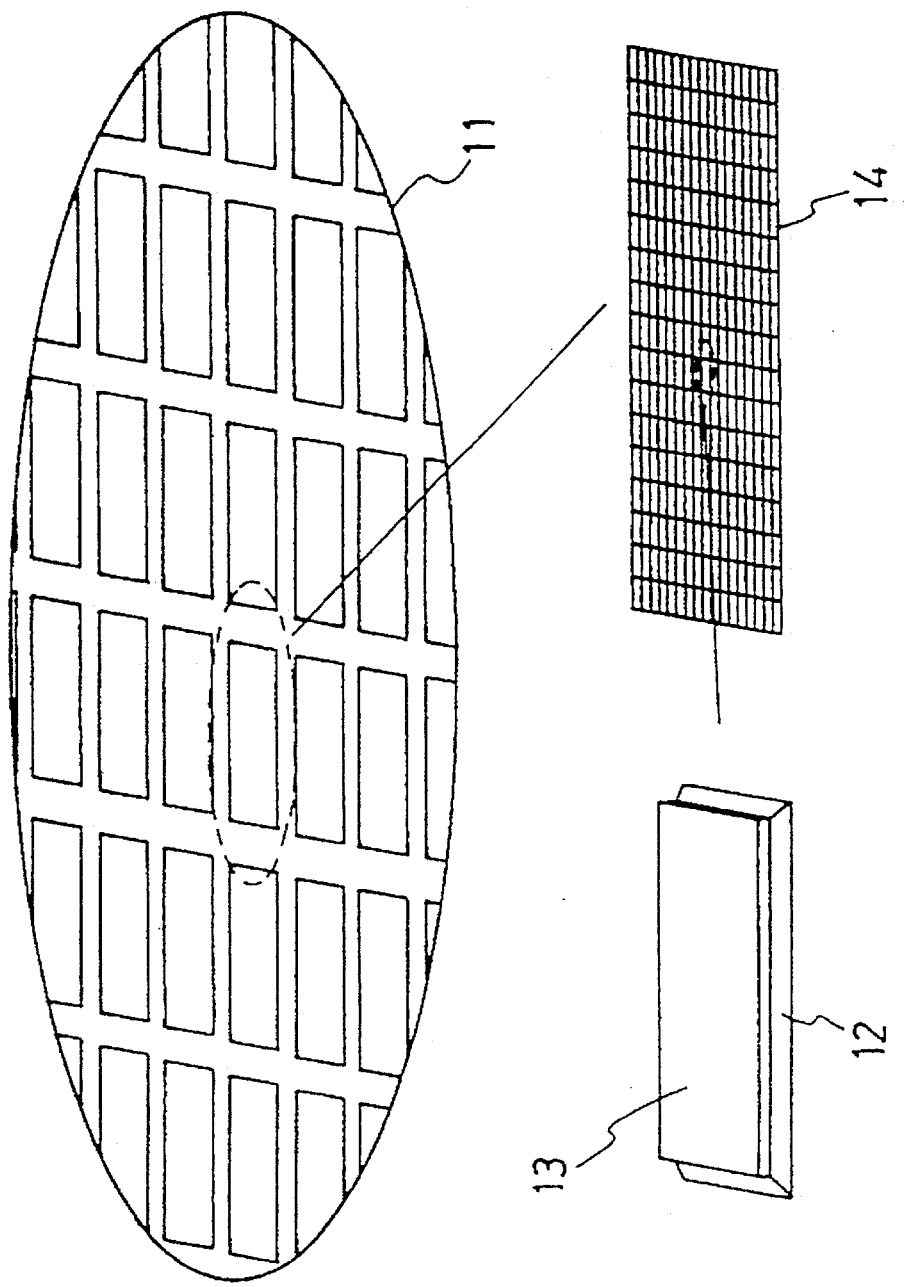
FIG. 4 illustrates schematic perspective views including an overview of a substrate in a process of fabricating infrared detection devices according to the present invention, and corresponding enlarged partial views.

FIG. 4 illustrates schematic perspective views including an overview of a substrate in a process of fabricating infrared detection devices according to the present invention, and corresponding enlarged partial views.

A number of regions corresponding to chips 14 are defined on a surface of a substrate 11, a silicon wafer, for example. Each of the chips 14 as finally separated from each other is used as an infrared detection device. In each of chips 14, not-shown signal detection circuits to be explained later have been formed.

As shown in the first enlarged view, m×n(300×500, for example) of mesas 12 are formed on each of the chips 14. The second enlarged view shows a single mesa 12 having a pyroelectric thin film 13 formed thereon. Thus, each of the infrared detection devices includes m×n sensor elements each comprising a pyroelectric thin film 13, and the signal detection circuit. In general, signal detection circuits of the same in number as that of m×n sensor elements are prepared. Further, a pair of electrodes (upper electrode and lower electrode; both not shown) is formed to sandwich the pyroelectric thin film 13, in general. These electrodes transmit the unbalanced surface charges generated on the surface of the pyroelectric thin film 13 to the signal detection circuit.

Figure 5A:
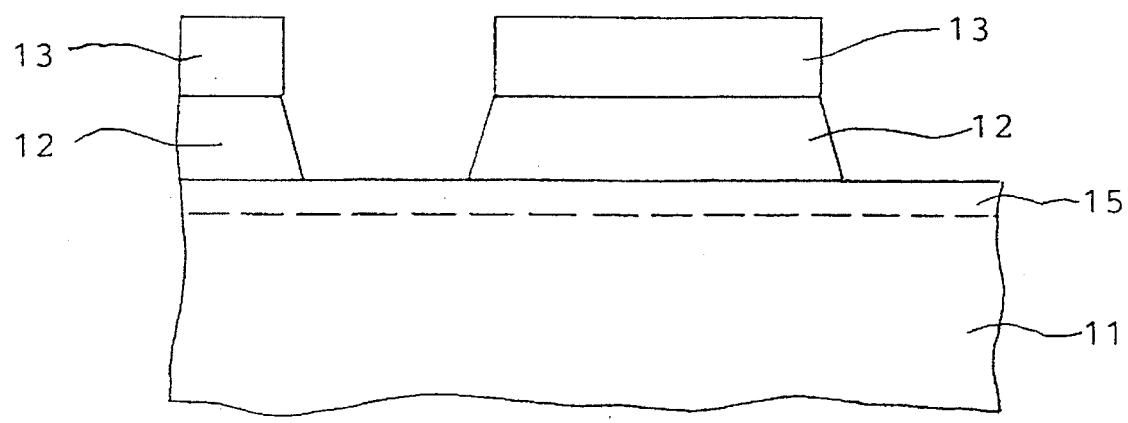
FIGS. 5A and 5B are cross-sections showing exemplary structures of mesas to be provided on a substrate for forming thereon a pyroelectric thin film according to the present invention.
Figure 5B:
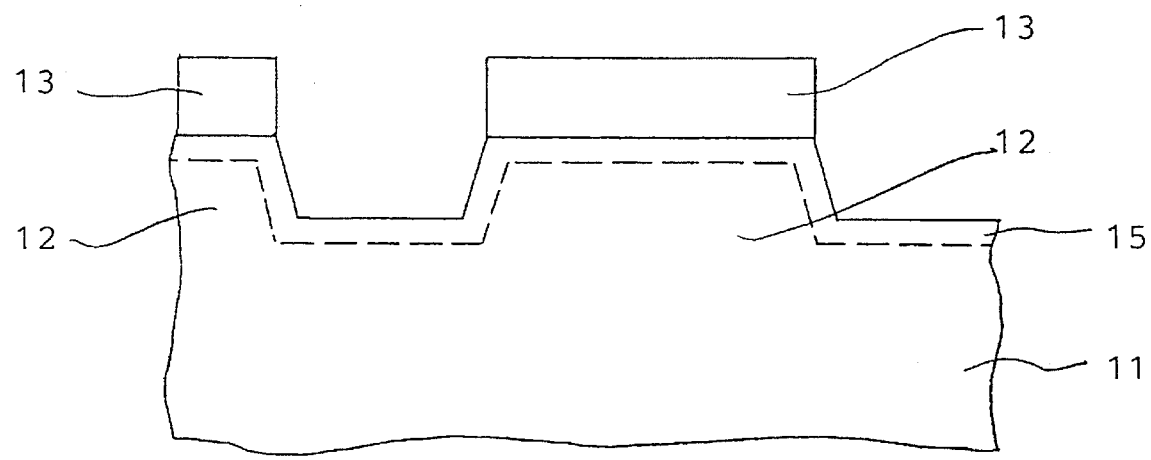

FIGS. 5A and 5B are cross-sections showing exemplary structures of mesas to be provided on a substrate for forming thereon a pyroelectric thin film according to the present invention.

The surface of the substrate 11, a silicon wafer, for example, having aforesaid signal detection circuits formed therein is generally covered with an insulation layer 15 composed of $SiO_2$, for example. In FIG. 5A, the mesas 12 are formed from another insulation layer deposited on the insulation layer 15 covering the surface of the substrate 11. The mesas 12 may simply be formed by selectively removing the portion of the insulation layer 15 by using a conventional lithographic technology. In any structure, the not-shown lower electrode and the pyroelectric thin film 13 are stacked on each of the mesas 12.

The mesas 12 may be formed by selectively removing the substrate 11 such as a silicon wafer, as shown in FIG. 5B, by using a conventional lithographic technology, wherein well-known anisotropic etching of silicon wafer may suitably be employed. An insulation layer 15 comprising $SiO_2$, for example, covers the entire surface of the semiconductor substrate having the mesas 12. On each of the mesas 12, a not-shown lower electrode and the pyroelectric thin film 13 are stacked. Further, as described later, such a structure that the lower electrode serves as the mesa 12 may be employed.

In FIGS. 5A and 5B, the pyroelectric thin film 13 is exclusively formed on a corresponding mesa 12. That is, a pyroelectric thin film 13 is formed according to the process as explained with reference to FIGS. 1A and 1B so as to cover the entire surface of the substrate 11 having mesas 12, and then, the pyroelectric thin film 13 is removed from the region around the mesas 12. In the following descriptions of the embodiments, structures similar to FIGS. 5A and 5B will be referred to, unless otherwise stated.

Figure 6A:
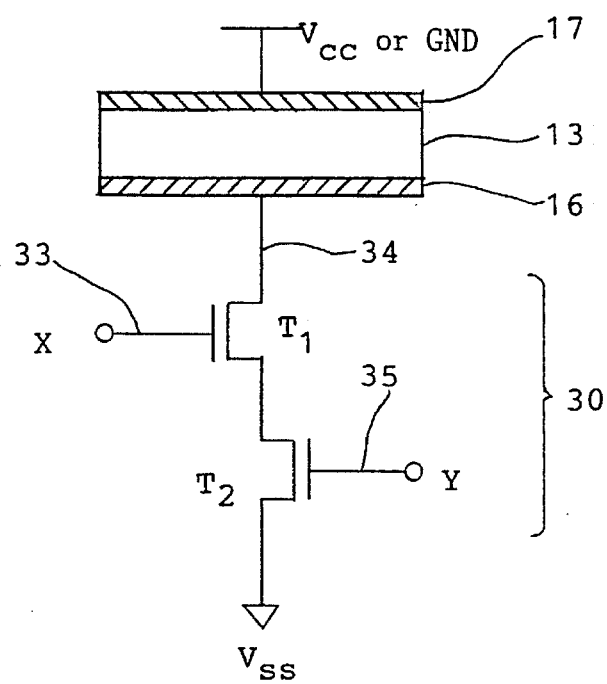
FIGS. 6A and 6B are the equivalent circuit diagram of an exemplary signal detection circuit for an infrared detection device comprising a pyroelectric thin film and a schematic perspective view showing an exemplary spatial configuration of components constituting the circuit, respectively.
Figure 6B:
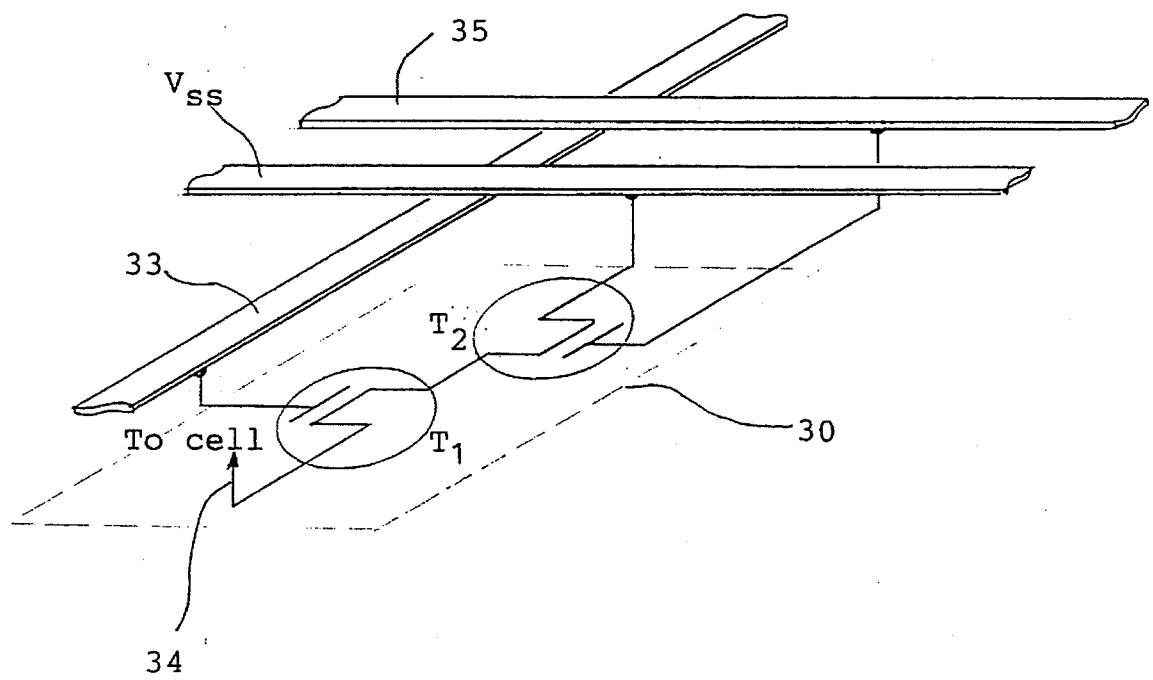

FIGS. 6A and 6B are the equivalent circuit diagram of an exemplary signal detection circuit for an infrared detection device comprising a pyroelectric thin film and a schematic perspective view showing an exemplary spatial configuration of components constituting the circuit, respectively.

Referring to FIG. 6A, the signal detection circuit comprises a couple of transistors $T_1$ and $T_2$ connected in series, for example. The gate electrodes of transistors $T_1$ and $T_2$ are connected to an X control signal line 33 and an Y control signal line 35, respectively. The source or drain of transistor $T_1$ is connected through a wiring 34 to the lower electrode 16 of the infrared sensor element comprising the pyroelectric thin film 13. The drain or source of transistor $T_2$ is connected to a power voltage line or a data line Vss and the upper electrode 17 of the infrared sensor element is connected to another power voltage line Vcc or ground (GND). In general, the signal detection circuit as shown is formed in the substrate directly under the corresponding infrared sensor element or the boundary region (groove 1A in FIG. 1A) between the corresponding infrared sensor element and an adjoining sensor element.

Referring to FIG. 6B, X control signal line 33, for instance, is disposed on a substrate (not shown) in which aforesaid transistors $T_1$ and $T_2$ are formed, with the intervention of insulation layer 15 (see FIG. 5A). Further disposed thereon are Y control signal line 35 and power voltage line Vss both extending perpendicular to the X control signal line 33 with the intervention of another not-shown insulation layer. Still further disposed thereon are lower electrode 16 and pyroelectric thin film 13 (see FIG. 6A) with the intervention of further another not-shown insulation layer.

Thus, m×n infrared sensor elements and corresponding m×n signal detection circuits, m lines of X control signal line 33, respective n lines of Y control signal line 35 and power voltage line Vss are spatially disposed on a chip 14 (see FIG. 4) and necessary interconnections are performed via through holes provided in the insulation layers intervening therebetween.

In FIG. 6B, X control signal line 33 may be formed to serve as a common gate of m transistors $T_1$ arranged in the same row or column. Further, Y control signal line 35 and power voltage line Vss may be disposed beneath X control signal line 33, wherein Y control signal line 35 may be formed to serve as a common gate of n transistors $T_2$ arranged in the same column or row.

The upper electrode 17 may be common to all of the infrared sensor elements on a chip 14, in a structure such as covering entire surface of the chip 14. However, it is desirable to form the upper electrode 17 separated for each of the infrared sensor elements in order to avoid thermal interference between the infrared sensor elements. For this purpose, it is advantageous to dispose each of the power voltage lines Vcc or ground lines (GND) on an insulation layer exposed between the infrared sensor elements and each of the upper electrodes 17 on the pyroelectric thin film 13 is individually connected to a corresponding one of the power voltage lines Vcc or ground lines (GND).

Various modifications may be employed including; 1) the power voltage line Vcc or ground line (GND) is formed from the same conductive layer as the lower electrode 16, 2) the power voltage line Vcc or ground line (GND) is formed from the same conductive layer as Y control signal line 35 and power voltage line Vss and is in parallel to these lines, 3) the power voltage line Vcc or ground line (GND) is formed from the same conductive layer as X control signal line 33 and is in parallel to the signal line 33. In these cases, it is necessary to form contact holes for interconnecting each of the upper electrodes 17 and a corresponding one of the power voltage lines Vcc or ground line (GND), in the insulation layers intervening therebetween.

Figure 7:
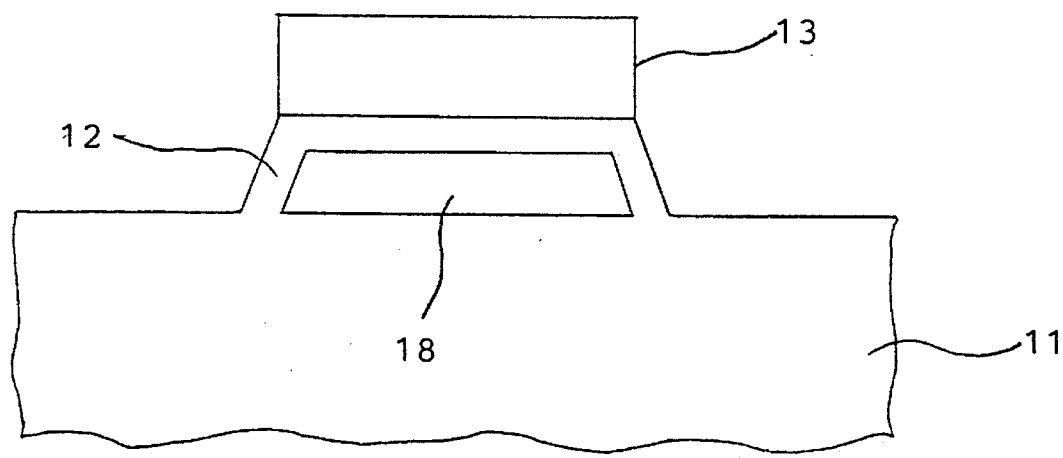
FIGS. 7 and 8 are cross-sections showing other exemplary structures of mesas to be provided on a substrate for forming thereon a pyroelectric thin film according to the present invention.
Figure 8:
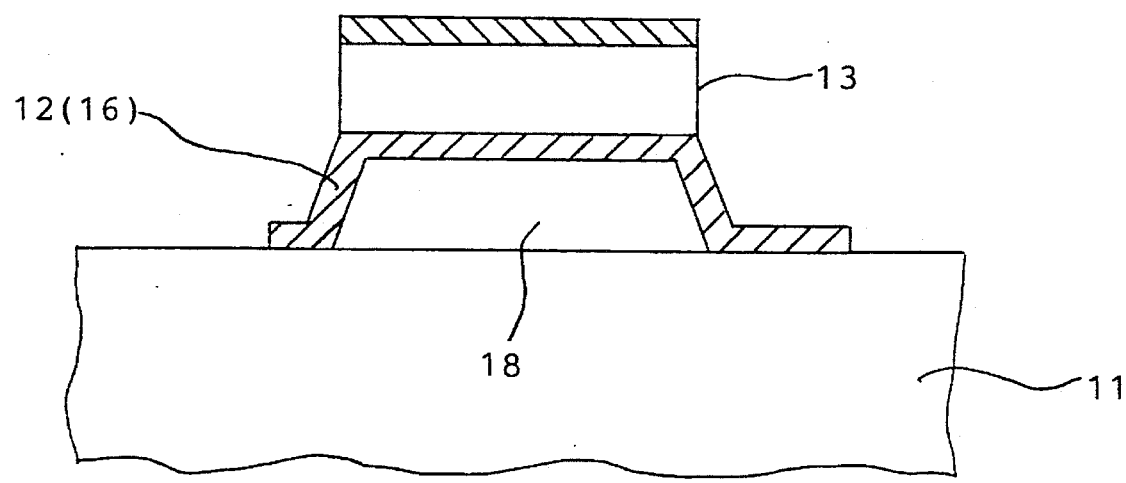

FIGS. 7 and 8 are cross-sections showing another structure of mesas, wherein each of mesas has a hollow.

Referring to FIG. 7, mesas 12 having a hollow are formed from an insulation layer. Such hollow-structured mesas 12 can be formed by the method as described below.

At first, a predetermined number of stripes composed of a first insulation layer is formed on a substrate 11. Next, a second insulation layer for covering the stripes is deposited on the substrate 11. Then, each of the stripes covered by the second insulation layer is selectively cut out into a predetermined number of portions by using an appropriate technique such as etching or ion milling. Next, the first insulation layer exposed at the cutout portion of each stripe is removed by using a selective etching. Thus, mesas 12 composed of the second insulation layer are left on the substrate 11.

When a conductor which is capable of withstanding to the selective etching for removing the first insulation layer is employed to substitute the second insulation layer in the above, mesas 12 composed of the conductor and having therein a hollow 18 is formed as shown in FIG. 8. The mesas 12 of FIG. 8 may serve as the lower electrode 16 of the sensor element comprising a pyroelectric thin film.

An intermediate structure of FIGS. 7 and 8 can be formed by substituting the conductor for only the upper portion of the second insulation layer.

Because of the hollow structure of mesas 12 as shown in FIGS. 7 and 8, the heat loss due to the conduction from the pyroelectric thin film 13 to the substrate 11 is decreased, and hence, the sensitivity of the infrared sensor elements each comprising the pyroelectric thin film 13 can be improved.

FIGS. 9 to 15 are cross-sections for explaining the fabrication process of an infrared detection device comprising a pyroelectric thin film according to the present invention.

Figure 9:
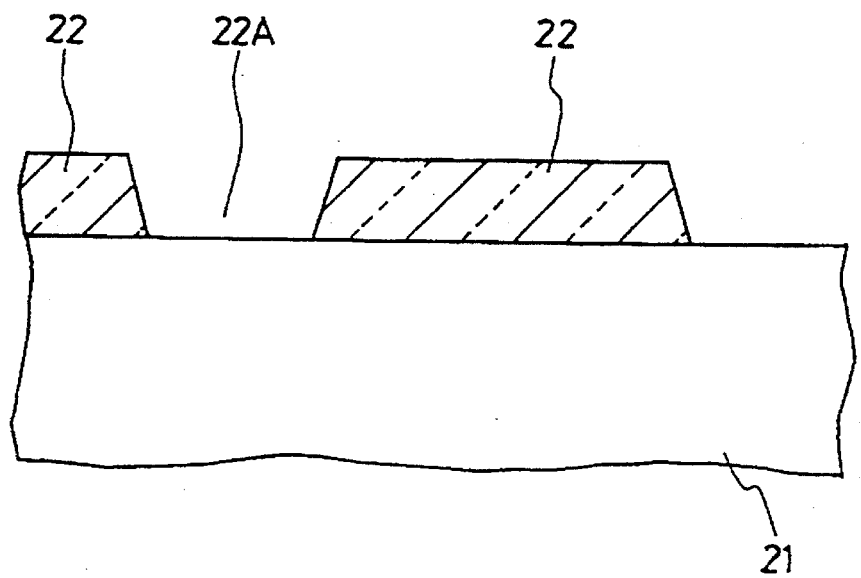
FIGS. 9 to 15 are cross-sections for explaining the fabrication process of an infrared detection device comprising a pyroelectric thin film according to the present invention.

Referring to FIG. 9, it is assumed that the signal detection circuits 30, control signal lines 33 and 35, and the power voltage line Vss have been formed on the surface of the substrate 21, for instance, a silicon wafer, as explained with reference to FIGS. 6A and 6B.

An $Si_3N_4$ layer (not shown) is deposited on the entire surface of the substrate 21, by using a well-known method such as CVD (chemical vapor deposition). The surface of the $Si_3N_4$ layer is flattened by a polishing. Then, a PSG (phosphosilicate glass) layer having a thickness of about 1 µm is deposited on the flattened surface of the $Si_3N_4$ layer, by using a CVD.

The PSG layer is patterned by using a well-known lithographic technology including a resist process and an etching process, wherein a buffered hydrofluoric acid solution may be used as etchant. Hence, mesas 22 each composed of PSG and having a size of 100 µm square are formed. The mesas 22 are arranged in rows and columns in each of chip regions defined on the surface of the substrate 21. The width of the groove 22A between adjoining mesas 22 is about 20 µm.

Figure 10:
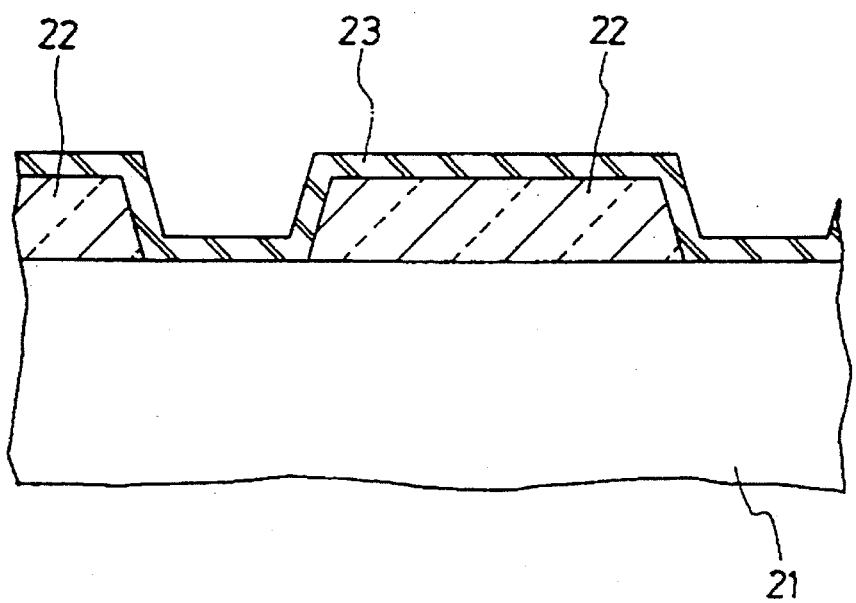

Referring to FIG. 10, an $Si_3N_4$ layer 23 having a thickness of about 0.3 µm is deposited on the substrate having mesas 22, by using CVD. The $Si_3N_4$ layer 23 serves to protect aforementioned signal detection circuit 30 already formed in the substrate 21 from the etching for selectively removing the pyroelectric thin film in the groove 22A later. The $Si_3N_4$ layer 23 also serves to protect the pyroelectric thin film formed on the mesas 22 from the etching during when the mesas 22 is converted into a hollow structure as explained with reference to FIG. 7, wherein the $Si_3N_4$ may be used as the second insulation layer.

Figure 11:
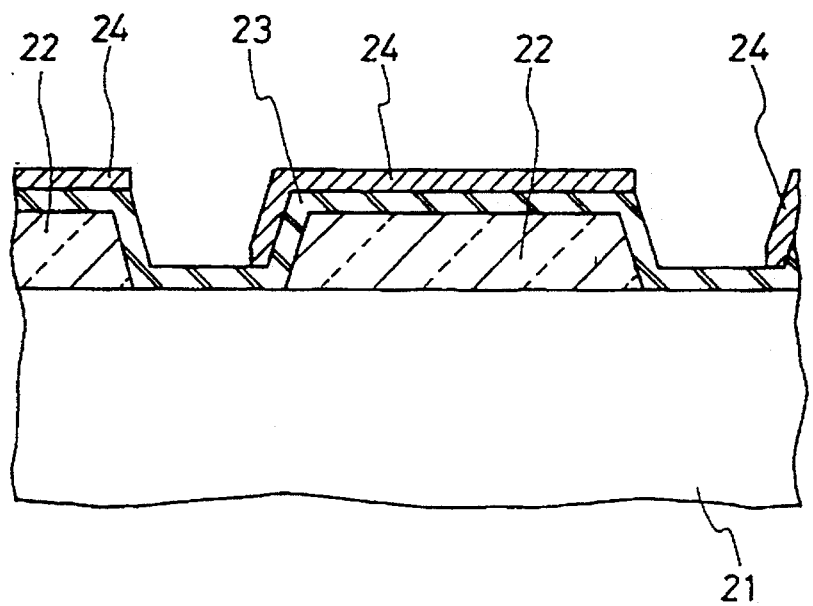

Referring to FIG. 11, a Ti film and a Pt film, each having a thickness of about 100 nm, are successively deposited on the substrate 21 by using a conventional vacuum deposition or sputtering. These films are patterned into Pt/Ti double-layered lower electrodes 24 by using a conventional lift-off or ion-milling technique.

Figure 12:
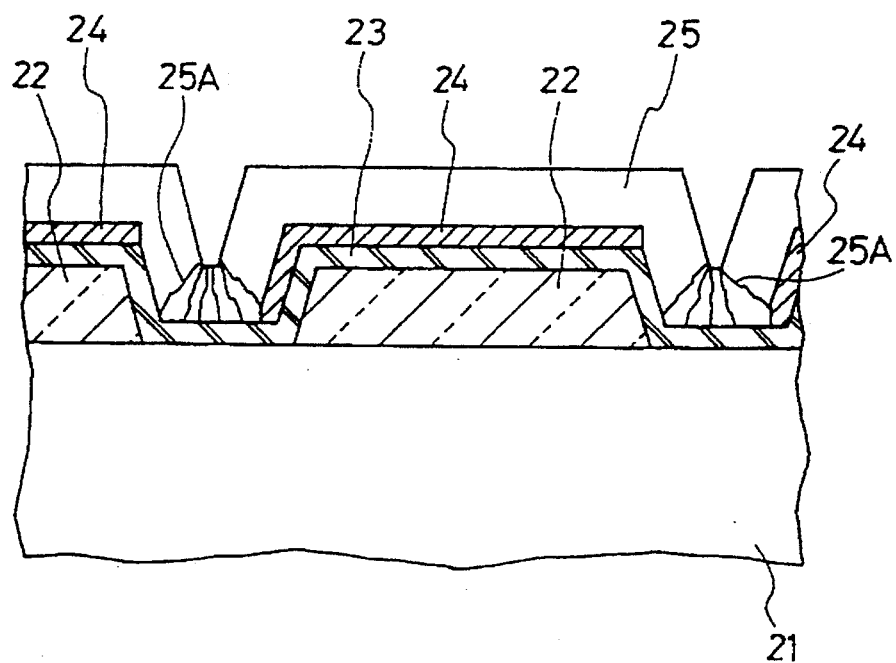

Referring to FIG. 12, a pyroelectric thin film 25 of about 1 µm is coated on the substrate 21 having the lower electrodes 24 formed on the mesas 22, by using sol-gel process. That is, BST pyroelectric material precursor solution is spin-coated on the surface of the substrate 21, and the spin-coated layer is dried at room temperature for 10 to 20 minutes. The dried layer is subjected to a pre-heat treatment of 500 ° C. for 20 minutes, then, heat baked at 700° C., 30 minutes in an ambient such as dry oxygen. Thus, a BST pyroelectric material precursor layer of about 100 nm is formed.

By repeating the process from the spin coating to the heat treatment, a pyroelectric thin film 25 having a thickness of about 1 µm is formed. In general, cracks generate in the pyroelectric thin film 25 having a thickness such as 1 µm. However, in case of the substrate 21 having mesas 22, generation of the cracks is limited within the portions corresponding to the groove 22A (see FIG. 9) and the portion of the BST pyroelectric thin film 25 on each of the mesas 22 can be free from the cracks.

Figure 13:
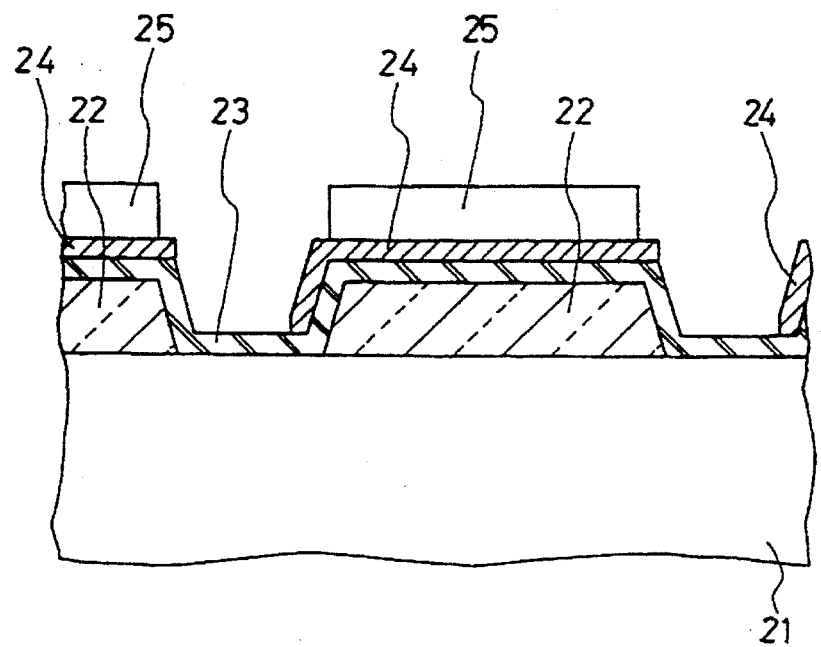

Referring to FIG. 13, the BST pyroelectric thin film 25 is patterned by using a conventional lithographic technique. That is, the BST pyroelectric thin film 25 is selectively masked on each of the mesas 22 by a resist, and the portions thereof exposed in the groove 22A are removed by etching using hydrofluoric acid solution as an etchant. Thus, the BST pyroelectric thin film 25 is selectively left on each of the mesas 22. A dry process such as reactive ion etching or ion milling may be employed in the above, instead of the wet etching using hydrofluoric acid solution.

Figure 14:
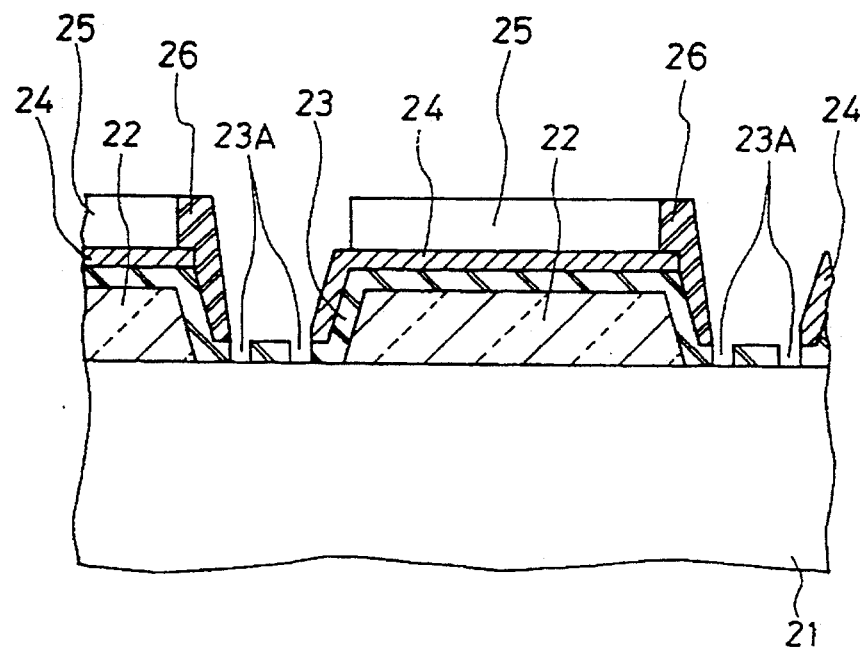

Referring to FIG. 14, a solution of a polyimide, for example, is coated on the substrate 21. The thickness of the polyimide coating is selected to be the same as that of the pyroelectric thin film 25. The polyimide coating is then patterned into layers 26 by using a well-known lithographic technique, for selectively covering the respective side surfaces of the pyroelectric thin film 25 and the mesa 22. In case where a non-photosensitive polyimide is employed in the above, the polyimide coating is etched by using a positive type photoresist mask. In case of a photosensitive polyimide, the polyimide coating is patterned like a photoresist.

Subsequently, contact holes 23A are formed in the $Si_3N_4$ film 23 exposed in the groove 22A according to a conventional lithographic technique including a photoresist process and an RIE (reactive ion etching) process. The contact holes 23 are used for connecting the sensor elements comprising the BST pyroelectric thin film 25 to the aforementioned signal detecting circuit 30 (see FIGS. 6A and 6B).

Figure 15:
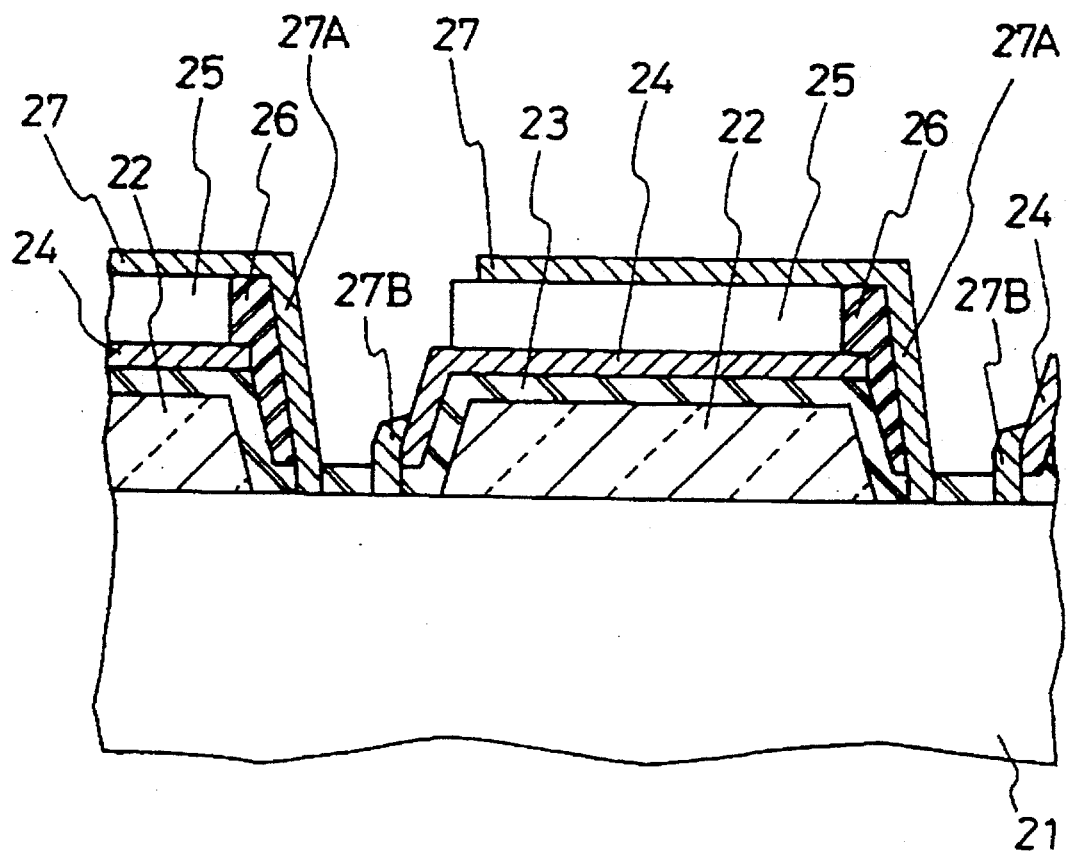

Referring to FIG. 15, an upper electrode 27 composed of a NiCr (nichrome) film and having a thickness of about 100 nm, for example, is formed on each of the BST pyroelectric thin films 25 by using a conventional vacuum deposition and lift-off techniques. Each of the upper electrodes 27 has an extended portion 27A for connecting the upper electrodes 27 to the aforementioned power voltage line Vcc or ground line (GND), for example. At the same time, interconnections 27B composed of a NiCr film are formed between the lower electrodes 24 and the signal detection circuits 30.

On the contrary to the above explanation, it is apparent that the upper electrode 27 may be connected to the signal detection circuit 30, while the lower electrode 24 may be connected to the power voltage line Vcc or ground line (GND).

Then, an infrared absorbing material comprising fine gold particles having approximate diameter of 20 nm (gold black) is deposited on each of the upper electrodes 27. Such gold particles can be formed by evaporating gold in an inert atmosphere such as Ar or He under a pressure ranging 10 Torr and 100 Torr.

What is claimed is:

1. An infrared detection device comprising:

a substrate having a surface which has a plurality of mesas, each of said mesas having a hollow structure, and a pyroelectric thin film formed on said surface having said mesas.

2. An infrared detection device as set forth in claim 1, wherein said pyroelectric thin film is separated into a plurality of portions thereof on said mesas.

3. An infrared detection device as set forth in claim 2, wherein said portions of said pyroelectric thin film correspond to sensor elements for detecting an infrared image.

4. An infrared detection device as set forth in claim 3, further comprising a plurality of signal detection circuits corresponding to said sensor elements, said signal detection circuits including transistors formed in said substrate.

5. An infrared detection device as set forth in claim 4 further comprising a plurality of electrode pairs each including upper and lower electrodes formed to sandwich corresponding said pyroelectric thin film, wherein at least either of said upper or lower electrodes has an extended portion thereof connected to corresponding one of said signal detection circuits.

6. An infrared detection device as set forth in claim 5, wherein said upper electrodes are formed of an infrared absorbing material.

7. An infrared detection device as set forth in claim 5, wherein each of said lower electrodes is formed to serve as corresponding one of said mesas having a hollow structure.

8. An infrared detection device as set forth in claim 5, wherein each of said signal detection circuits comprises a couple of transistors serially connected each other.

9. An infrared detection device as set forth in claim 4, wherein each of said signal detection circuits is arranged in a region directly beneath corresponding one of said mesas.

10. An infrared detection device as set forth in claim 1, wherein said mesas are formed of an insulation material.

11. An infrared detection device as set forth in claim 1, wherein said mesas are formed of an insulation layer covering the surface of said substrate.

\* \* \* \* \*